United States Patent
Hamada et al.

(10) Patent No.: US 11,579,212 B2
(45) Date of Patent: *Feb. 14, 2023

(54) MAGNETO-SENSITIVE WIRE FOR MAGNETIC SENSOR AND PRODUCTION METHOD THEREFOR

(71) Applicant: AICHI STEEL CORPORATION, Tokai (JP)

(72) Inventors: Norihiko Hamada, Aichi-ken (JP); Akihiro Shimode, Aichi-ken (JP)

(73) Assignee: AICHI STEEL CORPORATION, Tokai (JP)

( * ) Notice: Subject to any disclaimer, the term of this patent is extended or adjusted under 35 U.S.C. 154(b) by 339 days.

This patent is subject to a terminal disclaimer.

(21) Appl. No.: 16/638,557

(22) PCT Filed: Aug. 8, 2018

(86) PCT No.: PCT/JP2018/029826
§ 371 (c)(1),
(2) Date: Feb. 12, 2020

(87) PCT Pub. No.: WO2019/049597
PCT Pub. Date: Mar. 14, 2019

(65) Prior Publication Data
US 2020/0217904 A1     Jul. 9, 2020

(30) Foreign Application Priority Data
Sep. 11, 2017    (JP) .............................. JP2017-173714

(51) Int. Cl.
| | | |
|---|---|---|
| C22C 19/07 | (2006.01) | |
| C22F 1/10 | (2006.01) | |
| H01F 1/153 | (2006.01) | |
| H01F 41/02 | (2006.01) | |
| G01R 33/02 | (2006.01) | |
| C22F 1/00 | (2006.01) | |
| C22C 19/00 | (2006.01) | |

(52) U.S. Cl.
CPC .............. *G01R 33/02* (2013.01); *C22C 19/00* (2013.01); *C22C 19/07* (2013.01); *C22F 1/00* (2013.01); *C22F 1/10* (2013.01); *H01F 1/153* (2013.01); *H01F 1/15316* (2013.01); *H01F 1/15325* (2013.01); *H01F 1/15333* (2013.01); *H01F 1/15391* (2013.01); *H01F 41/02* (2013.01); *C22C 2202/02* (2013.01)

(58) Field of Classification Search
CPC ......... G01R 33/02; C22C 19/07; C22C 19/00; C22C 2202/02; C22F 1/00; C22F 1/10; H01F 1/15316; H01F 1/15333; H01F 1/15391; H01F 1/15325; H01F 1/153; H01F 41/02

See application file for complete search history.

(56) References Cited

U.S. PATENT DOCUMENTS

| | | |
|---|---|---|
| 4,527,614 A | 7/1985 | Masumoto et al. |
| 4,657,604 A | 4/1987 | Ogasawara et al. |
| 4,781,771 A | 11/1988 | Masumoto et al. |
| 4,859,256 A | 8/1989 | Sawa et al. |
| 5,240,066 A | 8/1993 | Gorynin et al. |
| 5,801,630 A | 9/1998 | Ho et al. |
| 6,417,771 B1 | 7/2002 | Tyrén |
| 6,648,990 B2 | 11/2003 | Yoshizawa |
| 7,473,325 B2 | 1/2009 | Yoshizawa et al. |
| 8,350,565 B2 | 1/2013 | Honkura et al. |
| 8,587,300 B2 | 11/2013 | Honkura et al. |
| 8,610,427 B2 | 12/2013 | Honkura et al. |
| 2001/0001397 A1 | 5/2001 | Chiriac et al. |
| 2002/0189718 A1 | 12/2002 | Yoshizawa |
| 2008/0129437 A1 | 6/2008 | Yoshizawa et al. |

(Continued)

FOREIGN PATENT DOCUMENTS

| | | |
|---|---|---|
| CN | 102414570 A | 4/2012 |
| EP | 0 212 863 A1 | 3/1987 |

(Continued)

OTHER PUBLICATIONS

Dong-Ming Chen, "Correlation of magnetic domains, microstructure and GMI effect of Joule-annealed melt-extracted Co68.15Fe4.35Si12.25B13.75Nb1Cu0.5 microwires for double functional sensors," Phys. Status Solidi A 210, No. 11, 2515-20 (Sep. 2013). (Year: 2013).*

K. Mohri, et al., "Magneto-Impedance Element", IEEE Transactions on Magnetics, Jul. 1995, pp. 333-338, vol. 31, No. 4.

International Search Report for PCT/JP2018/029826 dated Oct. 9, 2018 [PCT/ISA/210].

Written Opinion for PCT/JP2018/029826 dated Oct. 9, 2018 [PCT/ISA/237].

Shen et al., "Optimization of mechanical and giant magneto-impedance (GMI) properties of melt-extracted Co-rich amorphous microwires", Phys. Status Solidi, A 211, No. 7, pp. 1668-1673, 2014 (6 pages total).

(Continued)

*Primary Examiner* — Michael E. La Villa
(74) *Attorney, Agent, or Firm* — Sughrue Mion, PLLC

(57) ABSTRACT

A magneto-sensitive wire (magneto-sensitive body) made of a Co-based alloy having a composite structure in which crystal grains are dispersed in an amorphous phase. The Co-based alloy is, for example, a Co—Fe—Si—B-based alloy, and the total amount of Si and B is preferably 20 to 25 at % with respect to the Co-based alloy as a whole. Preferably, the average diameter of the crystal grains is 70 nm or less and the area ratio of the crystal grains is 10% or less to the composite structure as a whole. The magneto-sensitive wire has a circular cross section and the wire diameter is about 1 to 100 μm. Such a magneto-sensitive wire can be obtained, for example, through a heat treatment step of heating an amorphous wire composed of a Co-based alloy at a temperature equal to or higher than a crystallization start temperature and lower than a crystallization end temperature.

7 Claims, 2 Drawing Sheets

(56) References Cited

U.S. PATENT DOCUMENTS

| | | |
|---|---|---|
| 2011/0080164 A1 | 4/2011 | Honkura et al. |
| 2012/0038358 A1 | 2/2012 | Honkura et al. |
| 2013/0181705 A1 | 7/2013 | Honkura et al. |
| 2016/0319412 A1 | 11/2016 | Leary et al. |
| 2020/0217904 A1 | 7/2020 | Hamada et al. |
| 2021/0190886 A1* | 6/2021 | Tatematsu ............... C22C 45/04 |

FOREIGN PATENT DOCUMENTS

| | | |
|---|---|---|
| EP | 1 076 243 A2 | 2/2001 |
| EP | 1 237 165 A2 | 9/2002 |
| EP | 1 840 906 A1 | 10/2007 |
| EP | 2 276 082 A1 | 1/2011 |
| EP | 2 423 697 A1 | 2/2012 |
| JP | 57-079052 A | 5/1982 |
| JP | 62-27539 A | 2/1987 |
| JP | 62-27540 A | 2/1987 |
| JP | 2-310346 A | 12/1990 |
| JP | 4-348 A | 1/1992 |
| JP | 08-503891 A | 4/1996 |
| JP | 10-149911 A | 6/1998 |
| JP | 2000-164414 A | 6/2000 |
| JP | 2001-119081 A | 4/2001 |
| JP | 2002-327226 A | 11/2002 |
| JP | 4650591 B2 | 3/2011 |
| JP | 2012-078198 A | 4/2012 |
| JP | 6428884 B1 | 11/2018 |
| WO | 93/005904 A2 | 4/1993 |
| WO | 98/20467 A1 | 5/1998 |
| WO | 99/66466 A2 | 12/1999 |
| WO | 2009/119081 A1 | 10/2009 |

OTHER PUBLICATIONS

Communication dated Oct. 27, 2020 from the China National Intellectual Property Administration in CN Application No. 201880058378.3.

Communication dated Oct. 20, 2020 from the European Patent Office in EP Application No. 18852877.2.

International Search Report dated May 11, 2021 in International Application No. PCT/JP2021/006934.

International Search Report dated Dec. 24, 2019 in International Application No. PCT/JP2019/038876.

Extended European Search Report dated Nov. 19, 2021 in European Application No. 19880186.2.

International Preliminary Report on Patentability and Written Opinion of the International Searching Authority dated Apr. 27, 2021 in International Application No. PCT/JP2019/038876.

Ilker Kucuk et al., "Magnetocaloric and magnetoresistance properties in Co-based ($Co_{0.402}Fe_{0.201}Ni_{0.067}B_{0.227}Si_{0.053}Nb_{0.05}$)$_{100-x}Cu_x$(x=0-1) glassy alloys", Philosophical Magazine, 2016, vol. 96, No. 30, pp. 3120-3130 (12 pages total), (no month).

International Preliminary Report on Patentability and Written Opinion of the International Searching Authority dated Sep. 22, 2022 in International Application No. PCT/JP2021/006934.

Communication dated Jul. 8, 2021 by the China National Intellectual Property Administration in application No. 201880058378.3.

\* cited by examiner

Sample 4

MAGNETO-SENSITIVE WIRE FOR MAGNETIC SENSOR AND PRODUCTION METHOD THEREFOR

CROSS REFERENCE TO RELATED APPLICATIONS

This application is a National Stage of International Application No. PCT/JP2018/029826 filed Aug. 8, 2028, claiming priority based on Japanese Patent Application No. 2017-173714 filed Sep. 11, 2017.

TECHNICAL FIELD

The present invention relates to a magneto-sensitive wire used for magnetic sensors and also relates to relevant techniques.

BACKGROUND ART

Magnetic sensors have heretofore been used, such as fluxgate sensors (FG sensors), Hall sensors, giant magneto-resistive sensors (GMR sensors), and magneto-impedance sensors (MI sensors). In particular, MI sensors are superior to other sensors in terms of the sensitivity, responsivity, power consumption, and other properties and they are thus being used in various fields such as automobiles and medical services.

As the functionality of mobile terminals (such as smartphones) is enhanced in recent years, highly sensitive magnetic sensors are desired, such as those having a measurement range (e.g., about ±48 mT) that is far wider than the measurement range (about ±0.3 to 12 mT) required for an electronic compass to measure the geomagnetism (about 50 µT). In addition, magnetic sensors excellent in the heat resistance and durability are desired to allow for the use even under severe temperature environment and magnetic field environment, etc.

As an example, the measurement range of an MI sensor will be described below. In an MI sensor, an amorphous wire to which a high-frequency current or a pulse current is applied (simply referred to as an "amorphous wire") is used as a magneto-sensitive body, and the magnitude of magnetization rotation occurring in the circumferential direction in response to the strength of the surrounding magnetic field is detected as a change in impedance or a voltage. The measurement range of an MI sensor correlates with how likely the magnetization rotation occurs in the amorphous wire, which greatly depends on an anisotropic magnetic field (Hk). When the anisotropic magnetic field is small, the magnetization rotation is likely to occur and the measurement range is narrowed. In contrast, when the anisotropic magnetic field is large, the magnetization rotation is less likely to occur and the measurement range is widened.

Conventionally, adjustment of the anisotropic magnetic field has been mainly performed by allowing internal stress to remain in the amorphous wire. When the given internal stress is large, the anisotropic magnetic field is also large, while when the internal stress is small, the anisotropic magnetic field is also small. The internal stress has been given, for example, by performing heat treatment while applying tensile stress (also simply referred to as "tension") to the amorphous wire (this heat treatment will be simply referred to as "tension annealing (TA)"). The heating itself can be performed by passing the amorphous wire, to which tension is applied, through a heating furnace or by energizing the amorphous wire. In any case, the conventional heat treatment has been performed under a condition in which the amorphous state of the amorphous wire is maintained (heating at a temperature lower than the crystallization temperature or heating for a short time during which crystallization does not proceed even when the temperature is not lower than the crystallization temperature). Amorphous wires in which such internal stress is given are described, for example, in the following Patent Document 1 and Non-Patent Document 1.

PRIOR ART DOCUMENTS

Patent Documents

[Patent Document 1] WO2009/119081
[Patent Document 2] JP2012-78198A

Non-Patent Documents

[Non-Patent Document 1] IEEE Trans. Magn., 31(1995), 2455-2460

SUMMARY OF INVENTION

Technical Problem

Patent Document 1 describes a magneto-sensitive wire obtained by performing the tension annealing on an amorphous wire produced through a Taylor Ulitovski method (referred to as a modified Tailor method, hereinafter). In particular, Patent Document 1 describes a magnetic domain structure of the amorphous wire, but nothing in this document describes the anisotropic magnetic field.

Non-Patent Document 1 describes a magneto-sensitive wire obtained by performing the tension annealing after drawing an amorphous wire produced through an in-rotating-liquid spinning method to a desired diameter. In Non-Patent Document 1, the anisotropic magnetic field is adjusted by changing the temperature and stress during the tension annealing.

In Patent Document 2, the measurement range is changed by focusing on a demagnetizing field rather than the anisotropic magnetic field. Specifically, the demagnetizing field is increased by reducing the wire length (L) of the amorphous wire with respect to the wire diameter (D) to expand the measurement range. When the amorphous wire is shortened, however, the number of turns of a detection coil is also reduced, and the sensitivity of the MI sensor per one continuous wire is lowered. For this reason, in Patent Document 2, the wire is not only cut short but also electrically connected thereafter, so that the measurement range is expanded and the sensitivity is not lowered. However, nothing in this document describes discussion on the structure of the wire itself.

The present invention has been made in view of such circumstances and an object of the present invention is to provide a novel magneto-sensitive wire for magnetic sensors and relevant techniques in which the anisotropic magnetic field is adjusted based on the structural change of the wire itself, which is a different idea than the conventional one.

Solution to Problem

As a result of intensive studies to achieve the above object, the present inventors have newly found that the anisotropic magnetic field of a magneto-sensitive wire can be adjusted by dispersing (or precipitating) fine crystal grains in an amorphous phase. Developing this achievement, the present inventors have accomplished the present invention, which will be described below.

«Magneto-sensitive Wire for Magnetic Sensors»

(1) The magneto-sensitive wire for magnetic sensors (simply referred to as a "magneto-sensitive wire") of the present invention comprises a Co-based alloy having a composite structure in which crystal grains are dispersed in an amorphous phase.

(2) In the magneto-sensitive wire of the present invention, internal stress is generated in accordance with the density difference between the amorphous phase and the crystal grains (crystalline phase). Specifically, the crystal grains have a higher density than that of the amorphous phase, and when the crystal grains are formed, the internal stress (compressive stress) in the contraction direction acts on the magneto-sensitive wire.

This internal stress is not given by the tension annealing unlike the prior art, and the internal stress is therefore less likely to be relaxed even under a high-temperature environment and is thus stable. That is, the magneto-sensitive wire of the present invention exhibits a stable anisotropic magnetic field even under a high-temperature environment and other similar environments and is excellent in the heat resistance and durability.

Moreover, the fine crystal grains dispersed in the amorphous phase can pin the spin magnetization rotation (in particular, the rotation in the circumferential direction) in the magneto-sensitive wire and therefore act in a direction in which the anisotropic magnetic field is increased.

Thus, according to the magneto-sensitive wire of the present invention, the anisotropic magnetic field can be stably increased, and the heat resistance and durability can be improved. Moreover, in a magnetic sensor in which the magneto-sensitive wire is used, the measurement range is expanded, the reliability under a high-temperature environment is improved, and other advantageous effects can be obtained.

«Method of Producing Magneto-sensitive Wire for Magnetic Sensors»

The present invention can also be perceived as a method of producing a magneto-sensitive wire. That is, the present invention may be perceived as a method of producing a magneto-sensitive wire, comprising a heat treatment step of heating an amorphous wire comprising a Co-based alloy at a temperature equal to or higher than a crystallization start temperature and lower than a crystallization end temperature, wherein the above-described magneto-sensitive wire is obtained.

The heat treatment step according to the present invention may be performed without applying tensile stress (external stress) to the amorphous wire or may also be performed while applying tensile stress. When the heat treatment is performed while applying tensile stress, in addition to the above-described internal stress caused by the density difference in the composite structure, internal stress caused by the external stress can be additively or synergistically introduced into the magneto-sensitive wire.

Depending on the production condition in the in-rotating-liquid spinning method or the modified Tailor method, fine crystals may possibly be generated even without heat treatment, and in such a case, the effects described in the present invention can be obtained in a similar way. However, for the production with a stable degree of generation of fine crystals and for the adjustment to the target magnetic characteristics, it is preferred to generate the fine crystals through heat treatment in a subsequent step because the magneto-sensitive wire can be produced with more stable quality.

«Element/Sensor»

The present invention can also be perceived as an element or a sensor in which the above-described magneto-sensitive wire is used. For example, the present invention may be perceived as a magneto-impedance element (MI element) that includes the magneto-sensitive wire and a detection coil wound around the magneto-sensitive wire, a magneto-impedance sensor (MI sensor) that includes the MI element, or other similar devices.

«Others»

(1) The "crystal grains" as referred to in the present specification are usually very fine, but at least have a size (grain diameter) within a range in which the crystal grains can be observed with a transmission electron microscope (TEM). Suffice it to say that the grain diameter may be, for example, 1 nm or more in an embodiment, 5 nm or more in another embodiment, or 10 nm or more in a further embodiment. From another aspect, the grain diameter may preferably be, for example, 150 nm or less in an embodiment, 100 nm or less in another embodiment, or 80 nm or less in a further embodiment because coarse crystal grains cause an increase in the hysteresis of the magneto-sensitive wire or the like.

On the other hand, it suffices that the "amorphous phase" or "amorphous wire" as referred to in the present specification is at least in an amorphous state to such an extent that crystals cannot be observed with TEM.

The "crystallization start temperature" and "crystallization end temperature" as referred to in the present specification are determined as a first peak temperature (T1: primary crystallization temperature) and a subsequent peak temperature (T2: secondary crystallization temperature), respectively, that are obtained when differential scanning calorimetry (DSC) is performed on an amorphous wire.

(2) Unless otherwise stated, a numerical range "x to y" as referred to in the present specification includes the lower limit x and the upper limit y. Any numerical value included in various numerical values or numerical ranges described in the present specification may be selected or extracted as a new lower or upper limit, and any numerical range such as "a to b" can thereby be newly provided using such a new lower or upper limit.

EMBODIMENTS FOR CARRYING OUT THE INVENTION

Figure 1:
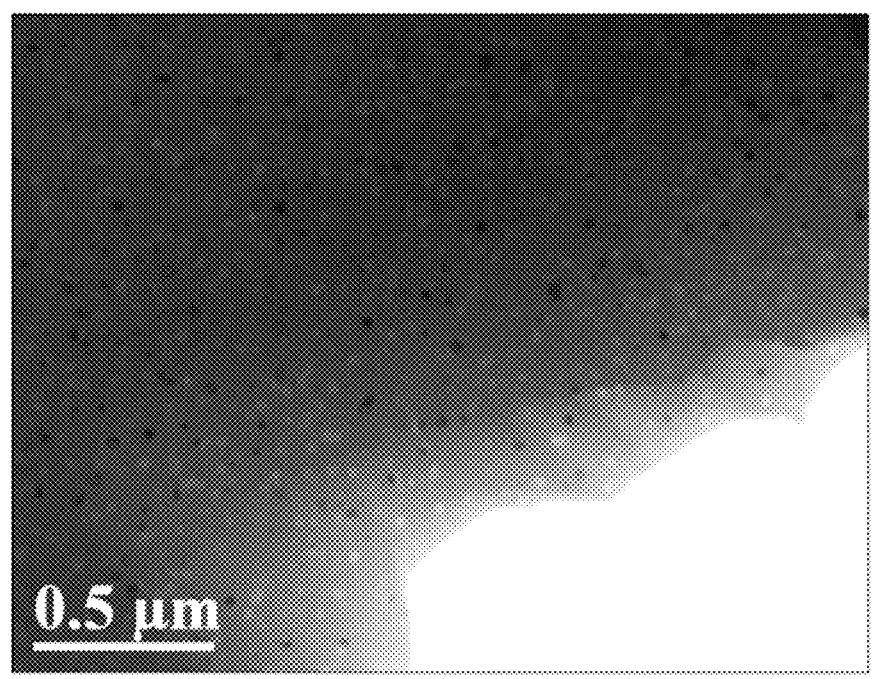
FIG. 1 is a BF-TEM image obtained when observing a wire cross section of Sample 4.

One or more features freely selected from the present specification can be added to the above-described features of the present invention. The content described in the present specification corresponds not only to the magneto-sensitive wire of the present invention but also to a method of producing the magneto-sensitive wire, as appropriate. Methodological features can even be features regarding a product.

«Alloy Composition»

The magneto-sensitive wire is composed of a Co-based alloy that contains 50 at % or more of Co with respect to the alloy as a whole. The Co-based alloy may contain a transition metal (Tm) other than Co, such as a group 8 element (Fe, Ni), Cr, Mo, or Cu.

Preferably, the Co-based alloy contains 20 to 25 at % in an embodiment or 21 to 24 at % in another embodiment of Si and/or B in total with respect to 100 at % of the Co-based alloy as a whole. If the total of Si and/or B is unduly large, the whole tends to be amorphous, while if the total of Si and/or B is unduly small, the whole will be readily crystallized to deteriorate the magnetic characteristics such as coercive force. In any case, it may be difficult to obtain a desired composite structure in which crystal grains are precipitated in the amorphous phase.

When an amorphous Co-based alloy that contains a certain amount of Si and/or B is heated, compounds called Tm—Si and/or Tm—B (unless otherwise stated, "Tm" includes Co) are crystallized to appear in advance and become the crystal grains as referred to in the present invention. The crystal grains appear at a temperature between the previously described crystallization start temperature (primary crystallization temperature) and crystallization end temperature (secondary crystallization temperature). As the temperature rises within the temperature range or the time elapses at a temperature within the temperature range, the number of crystal grains appearing in the amorphous phase increases.

«Composite Structure»

The magneto-sensitive wire is composed of a composite structure in which crystal grains are dispersed in an amorphous phase. The grain diameter of the crystal grains is, for example, 1 to 150 nm in an embodiment or 10 to 100 nm in another embodiment. Preferably, the average value of grain diameters (average diameter) is 5 to 70 nm in an embodiment or 10 to 50 nm in another embodiment. The crystal grains are preferably as fine as possible within the observable range. As the size of the crystal grains increases, the coercive force (iHc) of the magneto-sensitive wire also increases to cause an increase in the hysteresis of the magnetic sensor.

The grain diameter of the crystal grain as referred to in the present specification is specified based on a TEM image obtained when observing the cross section of the magneto-sensitive wire. Specifically, the grain diameter is determined by the diameter of a circle having the same area as an area occupied by each crystal grain (=circle equivalent diameter). The average diameter is obtained as an arithmetic average value of the grain diameters (circle equivalent diameters) of crystal grains in the field of view of the TEM image. Such grain diameters, average diameter, and other similar parameters are automatically calculated using image processing software attached to the TEM.

Preferably, the crystal grains have an area ratio of 0.05 to 10% in an embodiment, 0.1 to 7% in another embodiment, or 1 to 6% in a further embodiment to the composite structure as a whole. If the area ratio of the crystal grains is unduly small, the anisotropic magnetic field, heat resistance, and other similar properties of the magneto-sensitive wire will be insufficient. If the area ratio is unduly large, the influence of the crystal grains on the magneto-sensitive wire will increase to cause a deterioration of the sensitivity and an increase in the hysteresis of the magnetic sensor. The area ratio of crystal grains as referred to in the present specification is obtained as the sum of occupied areas of all crystal grains with respect to the entire field of view of the TEM image. Like the grain diameter, the area ratio of crystal grains is automatically calculated using the previously described image processing software.

«Production Method»

(1) Amorphous Wire

The amorphous wire can be produced through various methods. Examples of typical methods of producing amorphous wires include the modified Tailor method (references: WO93/5904, or Japanese Translation of PCT International Application, No. 8-503891, etc.) and the in-rotating-liquid spinning method (references: JP57-79052A, etc). The amorphous wire may be drawn to a desired wire diameter before the heat treatment step as appropriate.

(2) Heat Treatment Step

The magneto-sensitive wire of the present invention can be obtained, for example, by heat-treating an amorphous wire to allow the crystal grains to appear finely in the amorphous phase. The heat treatment temperature is preferably set to a temperature that is equal to or higher than the crystallization start temperature (primary crystallization temperature) and lower than the crystallization end temperature (secondary crystallization temperature). If the temperature is lower than the crystallization start temperature, crystal grains are less likely to appear, while if the temperature is equal to or higher than the crystallization end temperature, the crystal grains will rapidly increase to increase the coercive force of the wire, and/or the wire as a whole can be crystallized.

Depending on the component composition and wire diameter of the amorphous wire and other factors, the heat treatment time may be, for example, 0.5 to 15 seconds in an embodiment or 1 to 10 seconds in another embodiment. An unduly short time may cause insufficient appearance of the crystal grains, while an unduly long time may cause the crystal grains to readily grow to become coarse. In any case, it may be difficult to obtain a desired composite structure.

Depending on the heating means (method), the heat treatment for the amorphous wire performed in an extremely short time tends to be transient. For example, when the heat treatment step is performed by passing the amorphous wire through a heating furnace, the temperature of the amorphous wire itself is not necessarily equal to the set temperature in the heating furnace. It is therefore preferred to determine the set temperature and holding time (passage time) in the heating furnace separately from the heat treatment temperature and heat treatment time for the amorphous wire itself with consideration for the heat transfer to the amorphous wire, the heat conductivity in the amorphous wire, the heat capacity of the amorphous wire, and other similar factors.

Heating of the amorphous wire may be performed not only by a heating furnace but also by energization or the like. The heating is preferably performed in an inert gas atmosphere or a vacuum atmosphere. In any case, it is preferred in mass production to select a method capable of continuously heat-treating an amorphous wire of 100 m or more in an embodiment or 1,000 m or more in another embodiment.

The heat treatment step may be an annealing step performed without applying tensile stress (external stress) to the amorphous wire or may also be a tension annealing step performed while applying tensile stress. In the latter case, the internal stress due to the appearance of crystal grains and the internal stress due to the memory of external stress (residual external stress) are synergistically given to the magneto-sensitive wire. This can remarkably increase the anisotropic magnetic field of the magneto-sensitive wire.

The tensile stress may be within a range in which the amorphous wire is elastically deformed or within a range in which the amorphous wire is plastically deformed, provided that the amorphous wire does not break.

«Magneto-sensitive Wire»

The magneto-sensitive wire is not limited in its cross-sectional shape, wire diameter, or the like, but the cross section is usually circular. Preferably, the wire diameter is about 1 to 100 μm in an embodiment, about 3 to 50 μm in another embodiment, or about 5 to 30 μm in a further embodiment. If the wire diameter is less than 1 μm, the sensitivity of a magnetic sensor in which the wire is incorporated will be significantly lowered, while if the wire diameter exceeds 100 μm, the magneto-sensitive wire is less likely to be amorphous when produced.

It is also possible to control the magnetostriction of the magneto-sensitive wire by adjusting the alloy composition and the heat treatment condition. The magnetostriction can be affected more by the component composition of the amorphous phase (composition excluding the crystal grains) than by the overall composition of the wire. For control of the magnetostriction, therefore, it is preferred to adjust the overall composition of the Co-based alloy and the heat treatment condition thereby to control the component composition of the amorphous phase.

«Application»

The magneto-sensitive wire of the present invention can be used for various magnetic sensors such as MI sensors and FG sensors. In particular, the magneto-sensitive wire is suitably used in an MI sensor that is excellent in the responsivity, sensitivity, power consumption, and the like.

EXAMPLES

A number of wires were produced with different alloy compositions and different heat treatment conditions, and measurement of magnetic characteristics and observation of metal structures were conducted for these wires. In addition, for these wires, the change in the anisotropic magnetic field under a high-temperature environment was checked. The present invention will be described in more detail below with reference to such specific examples.

«Production of Samples»

(1) Amorphous Wires

Amorphous wires (raw material wires) having different alloy compositions and produced in different methods were prepared. The alloy compositions are listed below. In addition, differential scanning calorimetry (DSC) was conducted for the amorphous wires having respective alloy compositions, and the primary crystallization temperature (T1) and the secondary crystallization temperature (T2) thus obtained for each alloy composition are also listed below.

Alloy composition A: Co-4.6Fe-11.7Si-11.6B (unit: at %) T1=510° C., T2=558° C.
Alloy composition B: Co-4.7Fe-10.5Si-10.6B (unit: at %) T1=449° C., T2=576° C.

The total amount of Si+B was as follows: alloy composition A: 23.3 at % and alloy composition B: 21.1 at %.

The method of producing each amorphous wire was the modified Tailor method or the in-rotating-liquid spinning method as previously described. The amorphous wires obtained through the in-rotating-liquid spinning method were subjected to a drawing process to desired wire diameters. Then, various amorphous wires having different alloy compositions or produced in different methods were subjected to the heat treatment described later. It has been confirmed by X-ray diffraction that the entire structure of each amorphous wire is amorphous.

(2) Heat Treatment Step

Heat treatment was performed on each wire while changing the tensile stress (including zero) to be applied, the atmosphere temperature in the heating furnace for passing (temperature in the furnace), the time for passing through the heating furnace (staying time in the furnace), and the heating furnace length (i.e., the passing speed). The heat treatment was performed in the air atmosphere without exception. Thus, a number of heat-treated wires (samples) were obtained as listed in Table 1.

«Measurement»

The magnetic characteristics of each wire after the heat treatment were measured. Specifically, the anisotropic magnetic field (Hk) and the coercive force (iHc) were measured using a vibrating sample magnetometer. The magnetic characteristics obtained for the wires are also listed in Table 1.

«Observation»

TEM observation was performed on the cross section of each wire after the heat treatment. On the basis of the TEM image, the average diameter and area ratio of the crystal grains confirmed in the field of view (about 3 μm×2 μm) were calculated using the image processing software attached to the TEM (transmission electron microscope) as previously described. The structure morphology (situation of crystal grains) obtained for each wire is also listed in Table 1.

Figure 2:
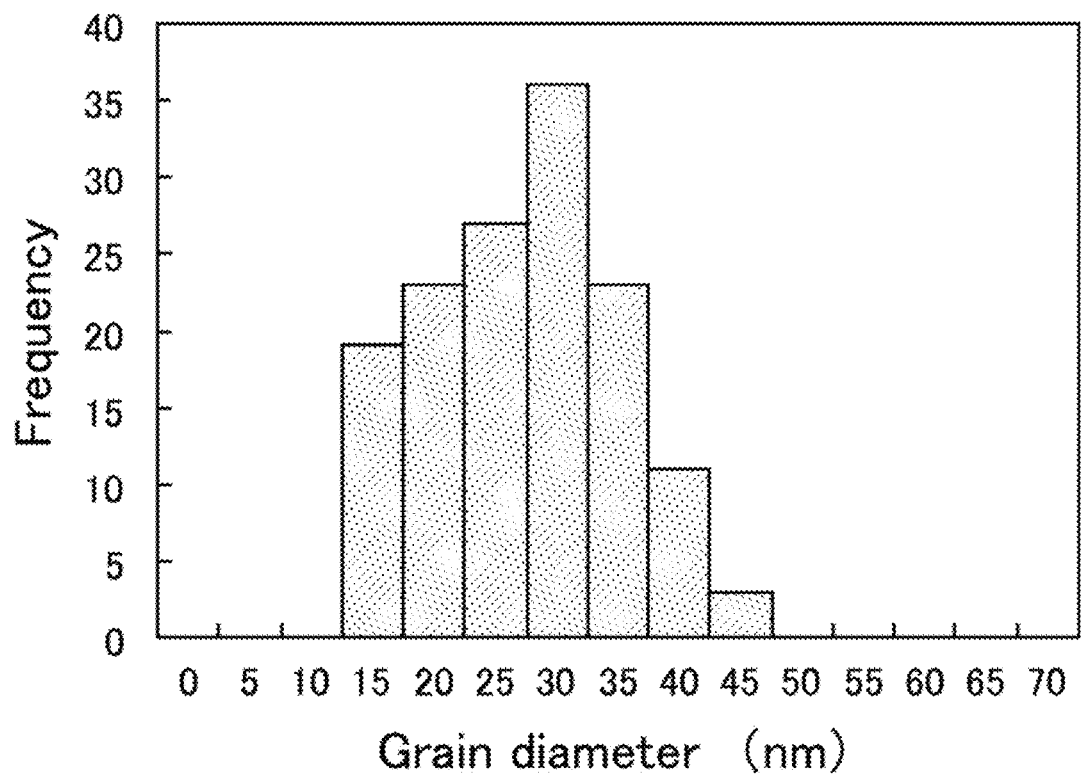
FIG. 2 is a grain diameter distribution of crystal grains counted based on the BF-TEM image.

For reference, a BF-TEM image according to Sample 4 is shown in FIG. 1. In addition, the grain diameter distribution of crystal grains counted based on the TEM image is illustrated in FIG. 2.

«Test»

(1) Heat Resistance Test

Wires after the heat treatment were held for one hour in the air atmosphere set to each heating temperature. Each time the heating and holding at each temperature were completed, the anisotropic magnetic field of each wire was measured. Through this measurement, how the anisotropic magnetic field of each wire changed at each temperature was checked. The results thus obtained are summarized and illustrated in FIG. 3.

(2) Durability Test

Wires after the heat treatment were held in the air atmosphere set to 250° C. For each holding time, the anisotropic magnetic field of each wire after the heat treatment was measured. Through this measurement, how the anisotropic magnetic field of each wire under the high-temperature atmosphere changed with time was checked. The results thus obtained are summarized and illustrated in FIG. 4.

«Evaluation»

(1) Composite Structure

As an example, a BF-TEM image of Sample 4 after the heat treatment as listed in Table 1 is shown in FIG. 1. In FIG. 1, small dots appearing black or white are fine crystal grains. It has been confirmed by the selected area diffraction that they are crystal grains. It has thus been found that a composite structure in which fine crystal grains are dispersed in an amorphous phase can be obtained by performing appropriate heat treatment on the amorphous wire. Moreover, as apparent from FIG. 2, it has also been found that, in the case of this sample, the crystal grains are very fine with a grain diameter of about 50 nm at the maximum. Furthermore, as listed in Table 1, Sample 4 had an average diameter of about 25 nm and an area ratio of about 4%. In addition, as a result of checking other samples at the same time, as listed in Table 1, it has been confirmed that, when appropriate heat treatment is performed, fine crystal grains having an average diameter of about 10 to 50 nm and an area ratio of about 0.1% to 10% are dispersed in the amorphous phase.

(2) Magnetic Characteristics and Composite Structure

As apparent from Table 1, in Samples 1 to 16, crystal grains dispersed in the amorphous phase were observed, but in Samples C1 and C3 to C5, only the amorphous phase was observed as in the conventional ones, and no crystal grains were observed. In any of Sample C1 and other similar samples, it appears that the temperature in the furnace is lower than the primary crystallization temperature of the wire and the temperature of the wire itself does not reach the primary crystallization temperature accordingly. In contrast, in Sample C2, the temperature in the furnace was much higher than the secondary crystallization temperature of the wire, and Sample C2 was therefore crystallized as a whole and unmeasurable with the same methods of measuring the crystal grain diameter and area ratio as those for other samples.

As can be seen from Samples 1 to 5, it is found that the average diameter and area ratio of the crystal grains increase as the temperature in the furnace rises. It is further found that the anisotropic magnetic field (Hk) also increases accordingly. Moreover, as can be seen from the comparison between Sample 3 and Sample 9, it has been found that, when the staying time in the furnace is increased, the crystal grains grow to increase the average diameter and the area ratio, resulting in an increase in Hk. In any case, it has also been found that the coercive force (iHc) does not substantially correlate with Hk and is within a certain range.

As can be seen from Samples 6 to 8, it has also been found that the tensile stress does not correlate with the average diameter and area ratio of the crystal grains. However, as the tensile stress increased, the anisotropic magnetic field (Hk) increased as in the prior art. As apparent from Sample 6, it has been found that the fine crystal grains are allowed to appear without applying tensile stress and the value of Hk can thereby be adjusted.

The Hk of a conventional amorphous wire subjected to the tension annealing was about 1.5 kA/m at most (see Sample C4, etc). In contrast, as apparent from the Hk value of Sample 5, it has been found that the adjustable range of Hk can be greatly expanded due to the dispersion of fine crystal grains in the amorphous phase. Thus, the wire can be easily produced so as to have appropriate Hk in accordance with the spec of a magnetic sensor to be produced, specifically, in accordance with the value of the measurement range of a magnetic sensor to be produced. That is, according to the present invention, the measurement range of the magnetic sensor can be expanded without relying on a method of cutting the wire short to increase the demagnetizing field as in the previously described Patent Document 2. As apparent from Table 1, it has been found that the same as Samples 1 to 9 applies to Samples 10 to 16 produced in a different method of producing amorphous wires (samples produced using the in-rotating-liquid spinning method) or having different compositions or different wire diameters.

(3) Heat Resistance

Figure 3:
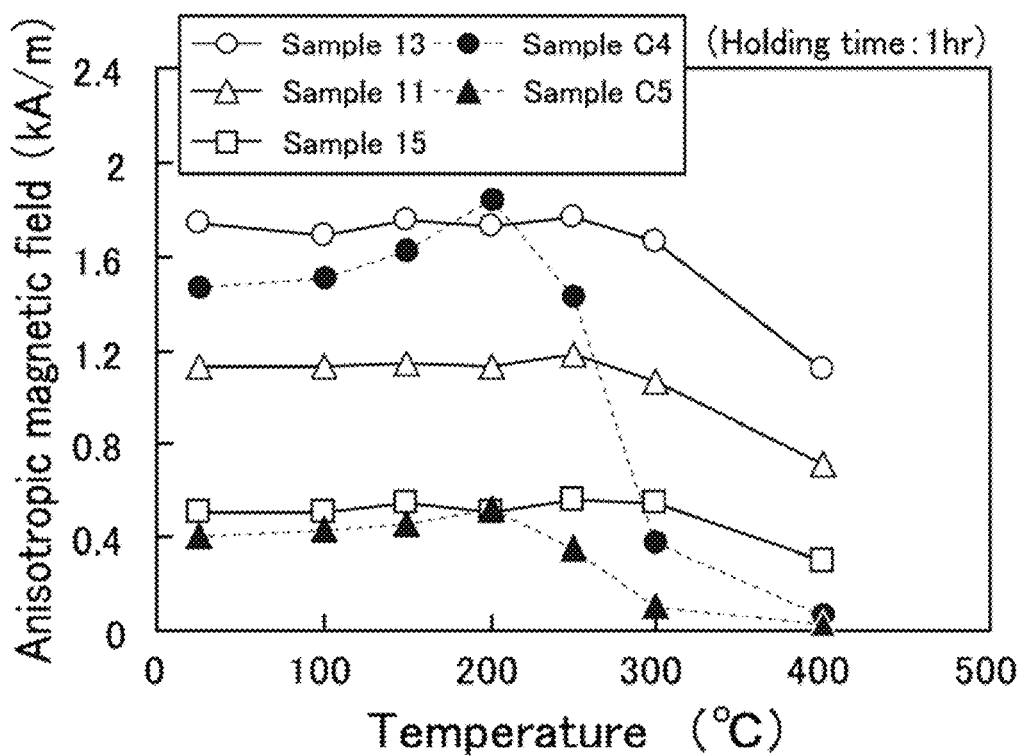
FIG. 3 is a graph illustrating the relationship between a heating temperature and an anisotropic magnetic field for each sample wire (this relationship represents the heat resistance).

As apparent from FIG. 3, it has been found that all of Samples 11, 13, and 15 each composed of a composite structure in which crystal grains are dispersed in an amorphous phase exhibit excellent heat resistance with almost no change in Hk up to 300° C. On the other hand, it has been found that Samples C4 and C5 each composed of an amorphous phase as a whole have a sharp decrease in Hk above 200° C. From this result, a magnetic sensitive wire having the composite structure can stably maintain its characteristics even under a reflow step in which the wire is heated up to about 300° C., for example, and under other similar steps.

(4) Durability

Figure 4:
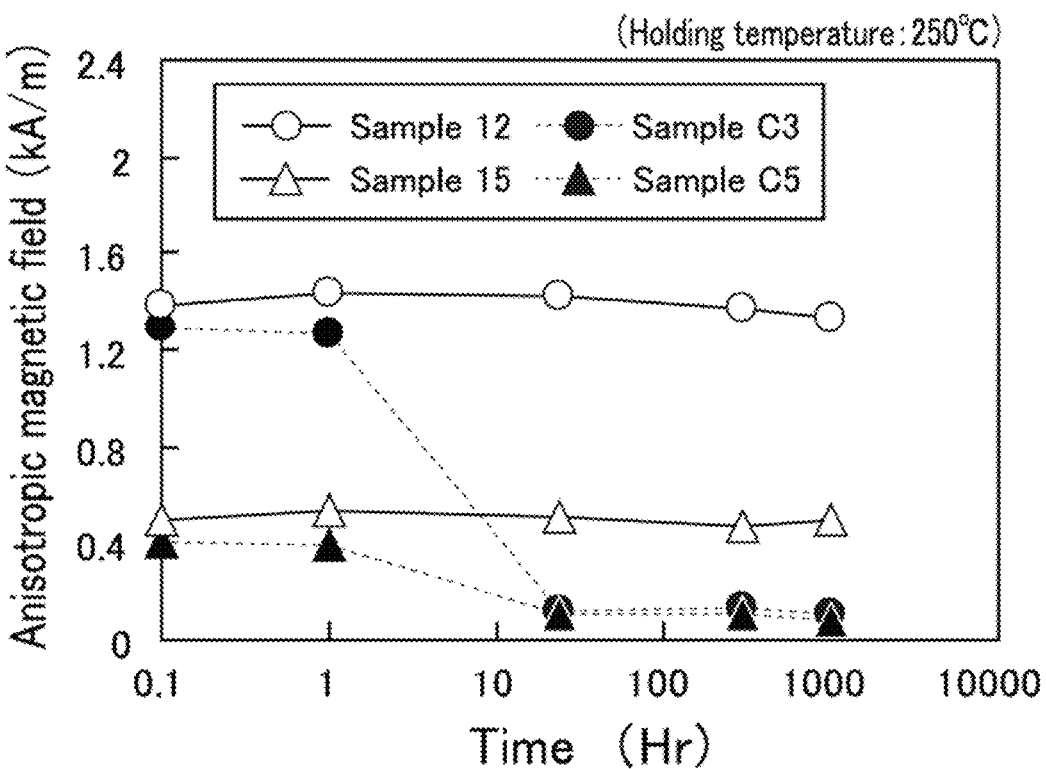
FIG. 4 is a graph illustrating the relationship between a heating time and an anisotropic magnetic field for each sample wire (this relationship represents the durability).

As apparent from FIG. 4, it has been found that Samples 12 and 15 each composed of a composite structure in which crystal grains are dispersed in an amorphous phase exhibit drastically excellent high-temperature durability with almost no change in Hk even when exposed to a high temperature of 250° C. for a long time. On the other hand, it has been found that Samples C3 and C5 each composed of an amorphous phase as a whole have a decrease in Hk even by heating for only about one hour.

TABLE 1

| | Amorphous wire | | | Heat treatment condition | | | | Magnetic characteristics | | Crystal grains | |
|---|---|---|---|---|---|---|---|---|---|---|---|
| | | | | | | | | Anisotropic | Coercive | | |
| Sample No. | Alloy composition | Production method | Wire diameter (μm) | Tensile stress (MPa) | Temperature in furnace (° C.) | Staying time in furnace (seconds) | Furnace length (m) | magnetic field Hk (kA/m) | force iHc (A/m) | Average diameter (nm) | Area ratio (%) |
| 1 | A | Modified | 11.5 | 200 | 595 | 3.8 | 0.4 | 0.7 | 13 | 18.5 | 0.1 |
| 2 | A | Tailor | 11.5 | 200 | 605 | 3.8 | 0.4 | 1.7 | 62 | 20.9 | 1.8 |
| 3 | A | method | 11.5 | 200 | 610 | 3.8 | 0.4 | 1.9 | 12 | 21.4 | 2.1 |
| 4 | A | | 11.5 | 200 | 625 | 3.8 | 0.4 | 4.4 | 53 | 24.9 | 3.8 |
| 5 | A | | 11.5 | 200 | 635 | 3.8 | 0.4 | 7.8 | 76 | 48.8 | 9.2 |
| 6 | A | | 11.5 | 0 | 610 | 3.8 | 0.4 | 0.7 | 12 | 19.5 | 3.1 |
| 7 | A | | 11.5 | 200 | 610 | 2.5 | 0.4 | 1.1 | 14 | 16.4 | 1.6 |
| 8 | A | | 11.5 | 300 | 610 | 3.8 | 0.4 | 2.3 | 11 | 20.3 | 3 |
| 9 | A | | 11.5 | 200 | 610 | 7.6 | 0.4 | 2.6 | 45 | 24.7 | 5.4 |
| 10 | A | In- | 13 | 150 | 535 | 3.8 | 1 | 0.5 | 10 | 15.2 | 0.1 |
| 11 | A | rotating- | 13 | 150 | 552 | 3.8 | 1 | 1.1 | 15 | 18.9 | 0.2 |
| 12 | A | liquid | 15.9 | 200 | 570 | 3.8 | 0.4 | 1.4 | 35 | 19.1 | 0.2 |
| 13 | A | spinning | 13 | 150 | 556 | 3.8 | 1 | 1.7 | 18 | 20.1 | 0.2 |
| 14 | A | method + | 13.3 | 200 | 580 | 3.8 | 0.4 | 4 | 72 | 29.8 | 5.6 |
| 15 | B | Drawing | 13 | 150 | 475 | 3.8 | 1 | 0.5 | 9 | 14.7 | 0.1 |
| 16 | B | | 13 | 150 | 495 | 3.8 | 1 | 1 | 16 | 16.8 | 0.2 |
| C1 | A | Modified | 11.5 | 200 | 500 | 3.8 | 0.4 | 0.2 | 12 | 0 | 0 |
| C2 | A | Tailor method | 11.5 | 200 | 650 | 3.8 | 0.4 | Unmeasurable | 7343 | Unmeasurable | Unmeasurable |
| C3 | A | In- | 20 | 1100 | 400 | 1.9 | 0.5 | 1.3 | 50 | 0 | 0 |

TABLE 1-continued

| | Amorphous wire | | | Heat treatment condition | | | | Magnetic characteristics | | Crystal grains | |
| | | | | | | | | Anisotropic | Coercive | | |
| Sample No. | Alloy composition | Production method | Wire diameter (μm) | Tensile stress (MPa) | Temperature in furnace (° C.) | Staying time in furnace (seconds) | Furnace length (m) | magnetic field Hk (kA/m) | force iHc (A/m) | Average diameter (nm) | Area ratio (%) |
|---|---|---|---|---|---|---|---|---|---|---|---|
| C4 | A | rotating-liquid spinning method | 15 | 1100 | 400 | 1.9 | 0.5 | 1.5 | 11 | 0 | 0 |
| C5 | A | rotating-liquid spinning method + Drawing | 13 | 150 | 475 | 3.8 | 1 | 0.4 | 11 | 0 | 0 |

Alloy composition A: Co—4.6Fe—11.7Si—11.6B (unit: at %)/T1 = 510° C., T2 = 558° C.
Alloy composition B: Co—4.7Fe—10.5Si—10.6B (unit: at %)/T1 = 449° C., T2 = 576° C.

The invention claimed is:

1. A magneto-sensitive wire for magnetic sensors, comprising a Co-based alloy having a composite structure in which crystal grains are dispersed in an amorphous phase, wherein
the Co-based alloy consists essentially of Fe, Si, B and Co, and contains 20 to 25 at % of Si and B in total with respect to 100 at % of the Co-based alloy as a whole, and
the crystal grains have an area ratio of 0.05% to 10% to the composite structure as a whole.

2. The magneto-sensitive wire for magnetic sensors according to claim 1, wherein the crystal grains have an average diameter of 70 nm or less.

3. The magneto-sensitive wire for magnetic sensors according to claim 1, wherein the crystal grains comprise a compound of at least one of Si and B, and at least one of Co and Fe.

4. The magneto-sensitive wire for magnetic sensors according to claim 1, wherein the magneto-sensitive wire has a circular cross section.

5. The magneto-sensitive wire for magnetic sensors according to claim 4, wherein the magneto-sensitive wire has a wire diameter of 1 to 100 μm.

6. A method of producing a magneto-sensitive wire for magnetic sensors, comprising
a heat treatment step of heating an amorphous wire comprising a Co-based alloy at a temperature equal to or higher than a crystallization start temperature and lower than a crystallization end temperature,
wherein the magneto-sensitive wire for magnetic sensors according to claim 1 is obtained.

7. The method of producing a magneto-sensitive wire for magnetic sensors according to claim 6, wherein the heat treatment step is performed while applying tensile stress to the amorphous wire.

* * * * *